(12) United States Patent
Steinmuller et al.

(10) Patent No.: US 8,770,827 B2
(45) Date of Patent: Jul. 8, 2014

(54) METHOD FOR COATING MICROMECHANICAL PARTS WITH HIGH TRIBOLOGICAL PERFORMANCES FOR APPLICATION IN MECHANICAL SYSTEMS

(75) Inventors: Detlef Steinmuller, Aldrans (AT); Doris Steinmuller, Aldrans (AT); Herwig Drexel, Igls (AT); Slimane Ghodbane, Innsbruck (AT); David Richard, Yverdon-les-Bains (CH); Pierre Cusin, Villars-Burquin (CH)

(73) Assignee: The Swatch Group Research and Development Ltd, Marin (CH)

( * ) Notice: Subject to any disclaimer, the term of this patent is extended or adjusted under 35 U.S.C. 154(b) by 94 days.

(21) Appl. No.: 13/319,446

(22) PCT Filed: May 18, 2010

(86) PCT No.: PCT/EP2010/056835
§ 371 (c)(1),
(2), (4) Date: Nov. 8, 2011

(87) PCT Pub. No.: WO2010/133607
PCT Pub. Date: Nov. 25, 2010

(65) Prior Publication Data
US 2012/0051192 A1    Mar. 1, 2012

(30) Foreign Application Priority Data
May 18, 2009  (EP) .................................... 09160548

(51) Int. Cl.
G04B 15/00    (2006.01)
C23C 16/52    (2006.01)

(52) U.S. Cl.
USPC ...................................... 368/124; 427/249.8

(58) Field of Classification Search
USPC ........................... 368/124; 427/249.8, 249.14
See application file for complete search history.

(56) References Cited

U.S. PATENT DOCUMENTS

| | | | |
|---|---|---|---|
| 5,308,661 A | 5/1994 | Feng et al. | |
| 6,066,399 A | 5/2000 | Hirano et al. | |
| 2005/0074636 A1* | 4/2005 | Moriwaki et al. | 428/694 TC |
| 2005/0227079 A1* | 10/2005 | Ravi | 428/408 |
| 2007/0269646 A1* | 11/2007 | Haverty et al. | 428/312.2 |
| 2010/0021695 A1* | 1/2010 | Naoyuki et al. | 428/173 |
| 2010/0147791 A1* | 6/2010 | Isowaki et al. | 216/22 |
| 2011/0122567 A1* | 5/2011 | Cheah et al. | 361/679.33 |

FOREIGN PATENT DOCUMENTS

| | | |
|---|---|---|
| AT | 399 726 B | 7/1995 |
| EP | 0 732 635 A1 | 9/1996 |

(Continued)

OTHER PUBLICATIONS

M. DiPalo, et al., "N-type doped nano-diamond in a first MEMS application", Phys. Stat. Sol. (a), 2006, pp. 3036-3041, vol. 203, No. 12.

Primary Examiner — Amy Cohen Johnson
Assistant Examiner — Matthew Powell
(74) Attorney, Agent, or Firm — Sughrue Mion, PLLC

(57) ABSTRACT

Method for coating micromechanical components of a micromechanical system, in particular a watch movement, comprising:
  providing a substrate component to be coated;
  providing said component with a diamond coating;
wherein diamond coating is provide by CVD in a reaction chamber and during CVD deposition, during the last portion of the growth process, a controlled change of the carbon content within the reaction chamber is provided, thereby providing a change of the sp2/sp3 carbon bonds in the vicinity of the surface. Corresponding micromechanical components are also provided.

16 Claims, 3 Drawing Sheets

(56) References Cited

FOREIGN PATENT DOCUMENTS

| EP | 1 182 274 A1 | 2/2002 |
| EP | 1 233 314 A1 | 8/2002 |
| EP | 1 622 826 A1 | 2/2006 |
| EP | 1 904 901 A1 | 4/2008 |
| WO | 02/31839 A1 | 4/2002 |

\* cited by examiner

METHOD FOR COATING MICROMECHANICAL PARTS WITH HIGH TRIBOLOGICAL PERFORMANCES FOR APPLICATION IN MECHANICAL SYSTEMS

CROSS REFERENCE TO RELATED APPLICATIONS

This is a National Phase Application in the United States of International Patent Application PCT/EP 2010/056835 filed May 18, 2010, which claims priority on European Patent Application No. 09160548.5 of May 18, 2009. The entire disclosures of the above patent applications are hereby incorporated by reference.

FIELD OF THE INVENTION

The invention relates to a method for coating micromechanical components of a micromechanical system, in particular a watch movement, in order to provide a reduction of the surface roughness and an enhancement of the tribological performances. The invention also relates to the corresponding micromechanical component for a micromechanical system, in particular a watch movement. The invention can be used in micromechanical watch movements, in particular for the realisation of escapement wheels and pallets and other friction-relevant components.

BACKGROUND TO THE INVENTION

The technical demands on micromechanical components are growing. Beside highest precision, there is a need to provide highest energy efficiency in the mechanical system, long lifetime and complete abdication of lubricants insofar as possible.

In the last few years, a lot of documents dealing with this subject have been published. The described approaches fulfil some of the tasks without being able to deliver a complete solution mainly due to the restrictions on the materials used.

Micromechanical components produced by mechanical machining (die cutting or shape cutting) exhibit two major disadvantages. First, they are either high priced or economically profitable only in mass production because investments are required for expensive production tools. Second, these processes reach their technical limits with an accuracy level lying by +/−5 micrometers.

Thus several alternative approaches have been discussed in literature. One of the most promising idea relates to the etching of micromechanical parts from silicon wafers achieving highest precision, even exceeding the results of the machining techniques by far. The tolerances can be reduced to the sub-micrometer range, but at the expense of lifetime: in practical results it was shown that the mechanical strength as well as the abrasive wear of these parts could not meet the demands in the absence of lubricant. One solution to the problem has been demonstrated in EP patent No 1 904 901: by treating the surface of the micromechanical parts with oxygen the strength and the lifetime could be extended, but without achieving an ultimate solution however.

The tribological performances could be enhanced by using special oils in mechanical systems, however at the expense of the demand for a dry running system.

The longest lifetime is achieved by classical machined parts made of steel, but these systems have reached their limits in regard to high accuracy and have to be further lubricated.

A further problem of the lubricated systems is the necessity for frequent service intervals, where the movements have to be cleaned and re-lubricated.

Thus the cycles of operation are limited and additional costs arise. These service intervals are necessary due to aging of the used oils which are loosing their properties with time.

Numerous approaches to fulfil all these requirements with one system have been undertaken.

In EP0732635B1 an approach is described where the micromechanical parts are etched from a silicon wafer and then coated with diamond films. The diamond films obtained via this method have a surface roughness higher than 400 nm. These films require therefore a subsequent polishing if the diamond coated parts are used in sliding contact applications.

EP1233314 discloses a mechanical clockwork assembly for watches having a mechanical escapement with an escapement wheel and an anchor wherein the functional elements of the escapement wheel are at least partially coated on their operating surfaces with a DLC (diamond like carbon) coating. DLC has a high $sp^2$ content (ranging from 30-100%) and is amorphous carbon which hardness is not sufficient for effective wear protection applications.

EP1622826 discloses a micromechanical component comprising a first surface and a second surface, which are substantially perpendicular in relation to one another wherein the first and/or the second surface consist at least partially of diamond.

U.S. Pat. No. 5,308,661 discloses a process for the pretreatment of a carbon-coated substrate to provide a uniform high density of nucleation sites thereon for the subsequent deposition of a continuous diamond film without the application of a bias voltage to the substrate.

EP1182274A1 discloses a method for the post-treatment of diamond coatings where a coarse-grained (micrometer regime) diamond coating is deposited on machining tools and subsequently treated be means of plasma processes. The aim of this post-treatment is the degradation of the top layers of the $sp^3$-hybridised diamond coating into $sp^2$-hybridised carbon species. The expectation is a filling of the "surface valleys" between the coarse grains protruding from the surface to achieve a more flat surface. The result of such method is a film having a coarse grain $sp^3$ diamond on top of which is a top layer of several hundred nanometers of $sp^2$ hybridised amorphous carbon. The top layer is relatively soft and will wear off quickly in applications involving high friction.

All the solutions described above can solve only partly the problem of providing micromechanical components featuring coefficient of friction lower than 0.05, and thus a large-scale production was prevented which is however demanded in the watch industry for instance.

In particular, when using diamond-coated silicon, the solutions described above raised the following problems: the diamond coated micromechanical components often exhibit a high initial coefficient of friction because of the microcrystalline structure of the diamond coatings. This high coefficient of friction severely limits the efficiency of the micromechanical system during the first hours of its life.

It is well known that surfaces with a roughness above several hundred nanometers cannot achieve straightforwardly low coefficients of friction. Moreover, utilising coarse diamond films in mechanical systems require a very smooth counterpart. In such cases the rough diamond film would grind into its corresponding counterpart leading to a very quick abrasive wear of the system and its breakdown.

In theory, a special case is imaginable, where different roughness modules are fitting special conditions and therefore produce a low coefficient of friction. However the pressure on each single grain would be too high leading to a breaking and/or interlocking of the grains. The mechanical system would thus lose its properties quickly ending up in a high coefficient of friction and thus a blocking of the system. After the breakdown of the coating, the whole system would collapse and/or damage the whole watch.

Solutions suggesting a polishing after the diamond-coating and therewith a smoothening of the surface of the micromechanical components failed because of high costs, the low efficiency and an essential technical reason: the most important functional surfaces are the flanks of the micromechanical parts which are not accessible for mechanical polishing when mounted in a wafer. A polishing after removing the parts from the wafers is not easy and moreover uneconomic because of the multitude and the diminutiveness of the micromechanical parts. Solutions with plasma etching of a diamond coated wafer comprising the micromechanical parts have also failed due to non-homogeneities of the plasma polishing especially on the flanks of the parts which are the most important areas (see above).

Approaches using smaller crystal sizes (few hundreds nanometers) suffered similar problems in smaller dimensions. For instance, plasma etching of the flanks is not feasible because this process affects mainly the grain boundaries and etches the surfaces in an anisotropic way.

Additionally, anisotropy of the etching treatment can arise from several parameters. The etching efficiency depends strongly on crystallographic orientations of the diamond crystals. As diamond films grown on substrates other than diamond (silicon in most cases) exhibit a mixture of crystallographic orientations, then etching is non-uniform, which can even increase the surface roughness of diamond instead of decreasing it.

SUMMARY OF THE INVENTION

A general aim of the invention is therefore to provide a process allowing providing micromechanical components for a micromechanical system, in particular a watch movement, providing a longer lifetime with high tribological performances.

A further aim of the invention is to provide a process allowing providing micromechanical components for a micromechanical system, in particular a watch movement, reducing service intervals.

Still another aim of the invention is to provide micromechanical components for a micromechanical system, in particular a watch movement, enhancing tribological performances, reducing wear and friction among others.

These aims are achieved thanks to a process of coating micromechanical components of a micromechanical system, in particular a watch movement, and a micromechanical component for a micromechanical system, as defined in the claims.

There is accordingly provided a method for coating micromechanical components of a micromechanical system, in particular a watch movement, comprising:
providing a substrate component to be coated;
providing said component with a diamond coating;
wherein diamond coating is provided by CVD (chemical vapour deposition) in a reaction chamber; during CVD deposition, during the last portion of the growth process, a controlled change of the carbon content within the reaction chamber is provided, thereby providing a change of the $sp^2/sp^3$ carbon bonds in the vicinity of the surface.

Thanks to the $sp^2$-hybridised components, a lubrication effect is accomplished leading to a further decrease in the coefficient of friction. In parallel, the reduction of the surface roughness also leads to an enhancement of the tribological performances. It is important to note that a single surface layer of $sp^2$-hybridised carbon on top of the diamond film or a diamond-like carbon film (DLC) would not deliver the same result since such a layer or film would wear fast due to the lower hardness and thus might be removed within a few cycles of the mechanical system. Moreover the adhesion of the $sp^2$-hybridised layer to the $sp^3$-hybridised matrix is far better when changing the $sp^2$-hybridised carbon contents gradually, as shown in FIG. 3.

In an advantageous embodiment, the change is an increase of carbon content in the diamond layer. This increase is obtained by increasing the proportion of carbon containing reactant gas, such as for instance methane.

In a further embodiment, the increase of carbon content is obtained by adding an additional carbon containing gas, such as for instance acetylene.

In a still further embodiment, the increase of carbon content is obtained by increasing the temperature and/or pressure within the processing reaction chamber.

In yet another embodiment, the increase of carbon content is obtained by adding gaseous nitrogen to the reaction chamber.

In a further advantageous embodiment, the increase of carbon content is obtained by replacing hydrogen (by up to 100% of the hydrogen content) by argon (or other element such as for instance nitrogen).

In a still further advantageous embodiment, the increase of carbon content is obtained by adding at least one of the rare gases (namely neon, helium, krypton or xenon).

In a variant, the increase of carbon content is obtained by lattice distortion.

In another variant, the increase of carbon content is obtained by post-treatment, such as for instance plasma or laser treatment.

In a variant, post-treatment consists in termination of the diamond-surface, wherein said termination is provided using an element selected from the list consisting of hydrogen, halogens, metals, electrical conductive minerals/organic molecules or proteins.

In another variant, post-treatment consists in adding metal containing compounds on top of the diamond in order to decrease the sticking properties.

In an advantageous variant, after the CVD steps, grain size is reduced (this enables to reduce surface roughness).

The invention further provides a micromechanical component for a micromechanical system, in particular a watch movement, obtained by a method as previously described. In an advantageous embodiment, the surface layer has a gradual increase of $sp^2$ hybridised carbon content.

Such mechanical components, produced for micromechanical systems allow the running of the mechanical system under dry (unlubricated) conditions, feature high tribological performances (very low friction coefficient, reduced wear, etc), are long-time stable and feature high energy efficiency.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

DETAILED DESCRIPTION OF THE INVENTION

Figure 1:
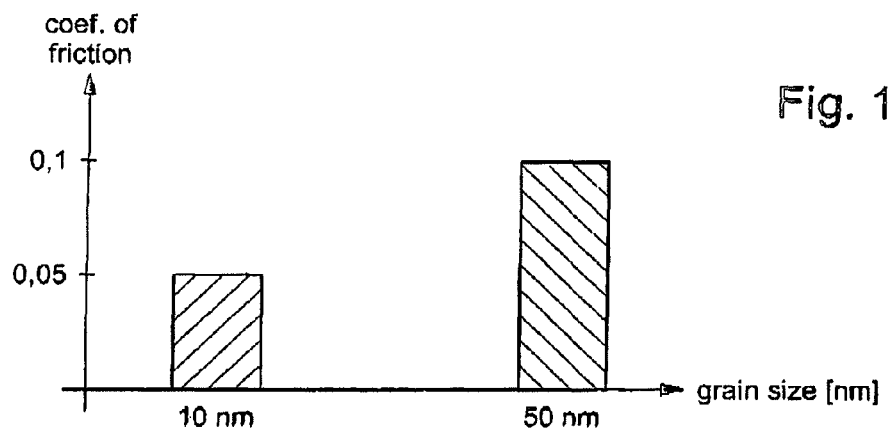
FIG. 1 is a graph showing the average coefficient of friction of a nanocrystalline diamond film (sliding on a nanocrystalline diamond film without lubrication) as a function of the grain size of diamond.

The invention presented is based on micromechanical components coated with nanocrystalline diamond films of thickness between several of nanometers and several micrometers. The crystals/grains have a size of a few nanometers, preferably less than 10 nanometers. These diamond films comprise coefficients of friction of less than 0.1, preferred less than 0.05, in special cases 0.03 or less (FIG. 1). Such nanocrystalline diamond films are produced by a CVD (chemical vapour deposition) process. In the special CVD process (discloses in AT399726B incorporated herein by reference) a carbon containing gas species (for example methane) is thermally activated and is deposited on a substrate as diamond ($sp^3$-hybridised carbon), as graphite ($sp^2$-hybridised carbon) as well as carbohydrates or other carbon species (mixtures of $sp^2$- and $sp^3$-hybridised carbon). To obtain a pure diamond layer it is necessary to use a second gas: hydrogen. The hydrogen gas ($H_2$) is also thermally activated resulting in mono-atomic hydrogen, where, as an important process step, the efficiency of the activation process is extremely high (more than 50%), preferably more than 75% and achieving in special cases 90% and more. Such a method is described in AT399726B.

Figure 2A:
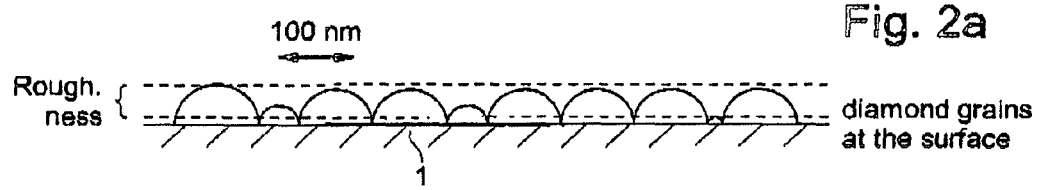
FIGS. 2a and 2b are schematic representations of the surface structure of a diamond film deposited according to the method of the invention for different grain sizes, resulting in a low roughness, and therefore a low initial coefficient of friction, when the grain size is the smallest.
Figure 2B:
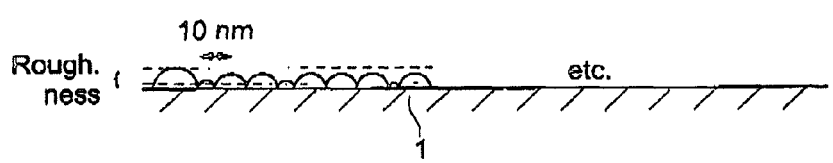

With this process, the nanocrystalline diamond coatings 1 (FIGS. 2a and 2b) can be deposited on silicon, with diamond crystal sizes of less than 8 nanometers having a surface roughness of less than 10 nanometers, for instance as shown in FIG. 2b.

Figure 4:
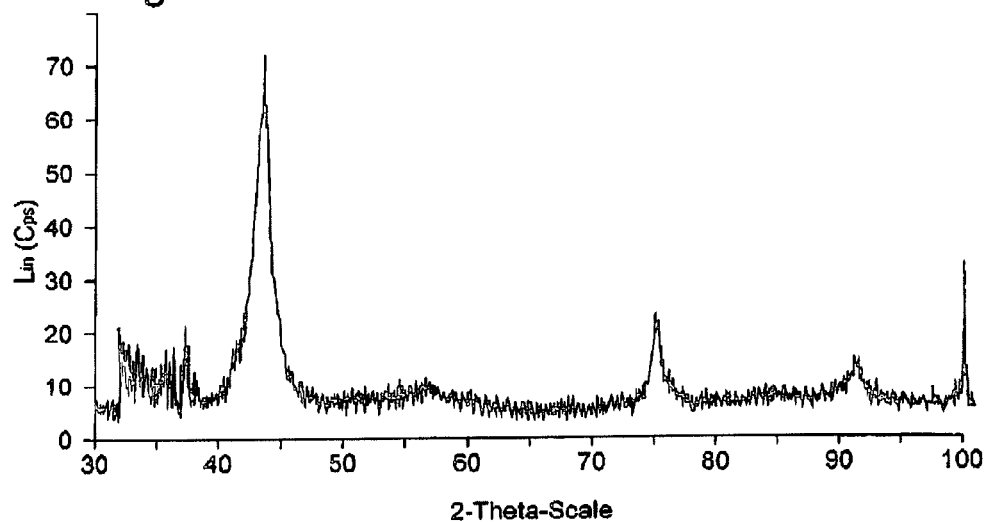
FIGS. 4 and 5 are respectively diagrams of X-Ray Diffraction—and Atomic Force Microscopy measurements of films obtained by the method disclosed in AT399726.
Figure 5:
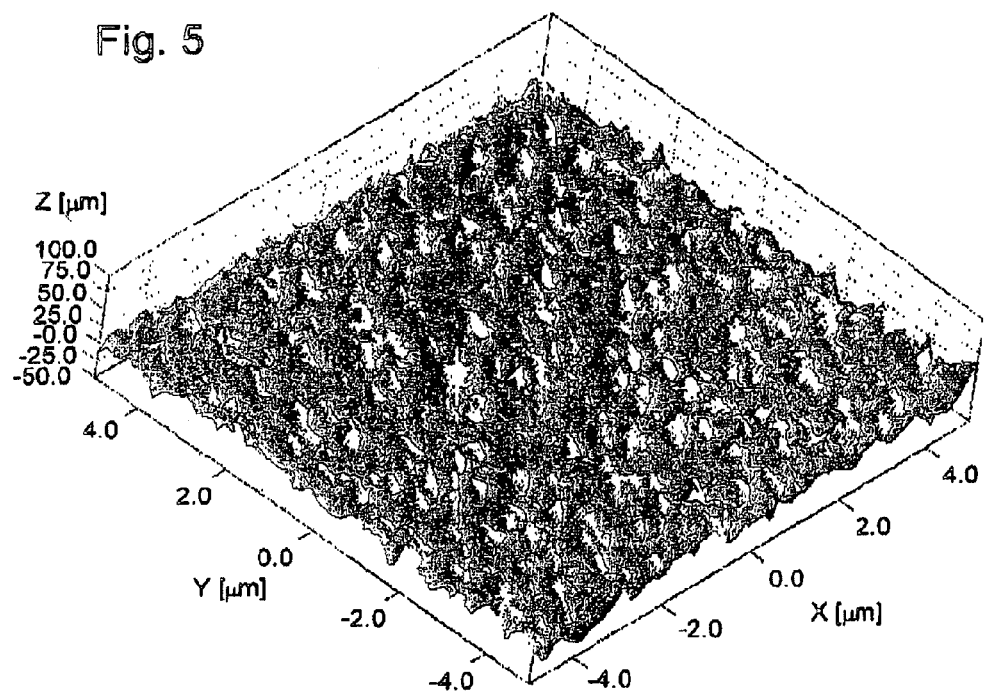
Figure 6:
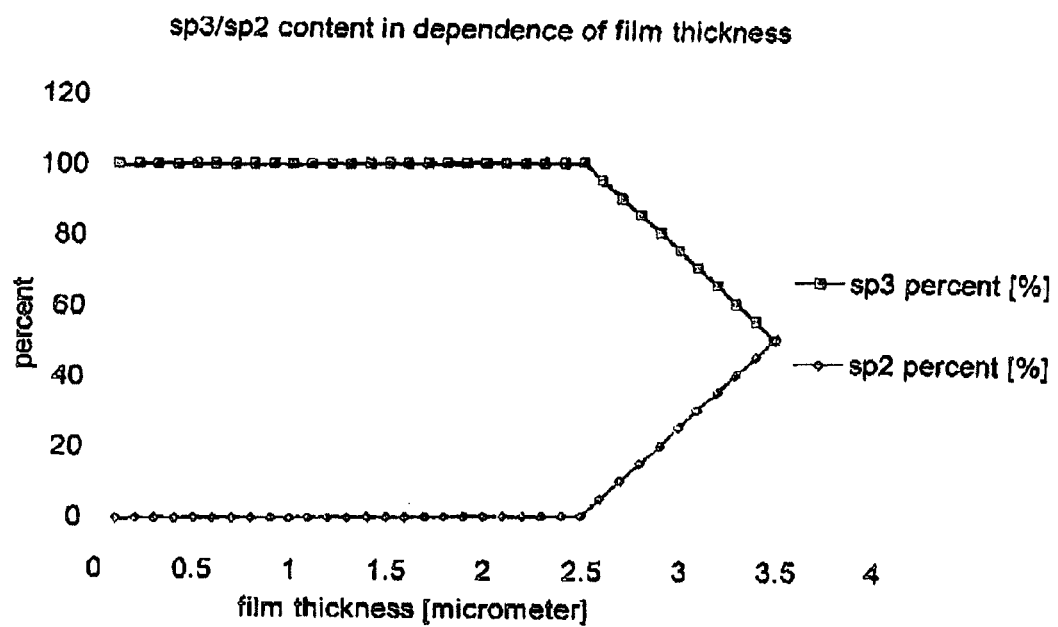
FIG. 6 is a graph showing the evolution of the $sp^3/sp^2$ content as a function of thickness of the deposited diamond film.

X-Ray Diffraction—and Atomic Force Microscopy measurements of films obtained by the method disclosed in AT399726B is shown in FIGS. 4 and 5.

Figure 3:
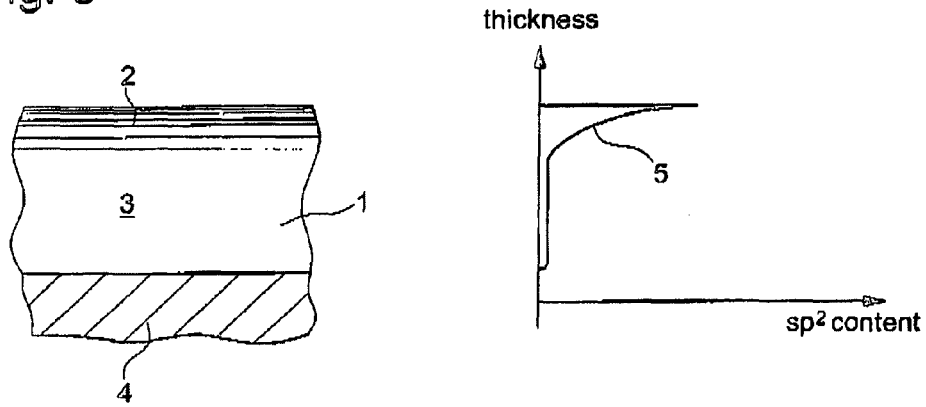
FIG. 3 is an illustration of an example of a local $sp^2$-distribution function.

A main aspect of the present invention relates to a nanocrystalline diamond coating, where during the growth of the diamond film the process is tuned in a way to achieve a gradual increase of $sp^2$-hybridised carbon content 2 in the $sp^3$-hybridised layer matrix in the vicinity of the surface of a substrate 4, as shown in FIG. 3. The right portion of FIG. 3 shows the evolution 5 of $sp^2$ content at the grain boundaries of the UNCD (Ultra Nano Crystalline Diamond) coating 3.

The following methods were demonstrated leading to such a gradual $sp^2$ enrichment comprising the idea of the invention without being limited to these methods.

Controlled increase of methane or carbon containing gas concentration or adding an additional carbon containing gas at the end of the growth process: during the last period of CVD diamond growth, a gradually controlled increase of the carbon containing reactant gas (e.g. methane) or adding an additional carbon containing gas (e.g. acetylene) changes the ratio of $sp^2/sp^3$ within the diamond matrix or diamond bulk material respectively leading to e.g. the highest amount at the surface or other local distribution-functions.

Deposition parameter variation: the deposition of nanocrystalline diamond according to the process referenced above (AT399726B) having the highest $sp^3$ content of more than 97% (detection limit) is performed at an optimal set of parameters comprising pressure in the vacuum system, temperature of the filaments, temperature of the substrate, gas flow of carbon containing gas, gas flow of hydrogen and distance between filaments and substrate. Due to increase or reduction of substrate temperature and/or pressure the $sp^2/sp^3$ ratio can be influenced additionally. This variation should be realised at the end of the growth process to achieve the gradual $sp^2$-enrichment close to the surface.

Nitrogen adding: during the growth of diamond, a certain quantity of gaseous nitrogen is introduced into the reaction chamber. The process of secondary nucleation (growth of new diamond grains, instead of growing those already formed) is enhanced and this leads to a decreasing of the grain size, down to only a few nanometers. The smaller grains allow a lower roughness of the coating and moreover enhance the amount of $sp^2$-hybridised carbon. Another process, enlarging the $sp^2$ content in the diamond as well, is the inclusion of $sp^2$ grains in the $sp^3$ diamond matrix.

Argon adding: during the growth of diamond, the increase of methane concentration to a very high level and/or replacing up to 100% of hydrogen by argon or other elements such as nitrogen can also lead to the same effects.

Adding other elements: other gases of any kind may be used, such as the rare gases neon, helium, krypton or xenon, without being restricted to them.

By post-treatment: including a plasma or laser treatment, potentially in combination with gases which can change the surface of diamond and/or get inside its structure.

Lattice distortion (annealing in air or under controlled atmosphere, UV illumination, x-rays, ion implantation, etc.)

In addition or alternatively to the mentioned above solutions, the performance of UNCD (Ultra Nano Crystalline Diamond) coatings for mechanical systems could be enhanced further by post-treatments such as:

Termination (saturation of the dangling bonds) of the diamond-surface with hydrogen, oxygen, fluorine, molecules, oils, wax, etc.

Addition of metal containing compounds on top of the diamond allows the decrease of sticking properties or the deposition of deposit.

In addition to all the above-mentioned solutions, it is also possible to further decrease the grain size in order to reduce the surface roughness. With smaller grains it is possible to achieve smoother surfaces (refer to FIG. 2) and thus the tribological performances (coefficient of friction and wear among others) can be even further enhanced.

In addition to all the above-mentioned techniques, it is further possible to improve the tribological performances by appropriate nano-structuring of the surfaces of the friction elements. The structuring can be achieved either by structuring the substrate or by structuring the diamond coating itself. In case of structured substrate, it is preferable to use diamond coatings with very small grains to allow accurate replication of the structured surface.

These methods can be implemented alternatively or in combination to achieve the desired $sp^3/sp^2$ ratio.

Table 1 below shows an example of evolution of $sp^3/sp^2$ content as a function of thickness of the deposited diamond film for a micromechanical part with a low friction coefficient for an application in a watch movement.

TABLE 1

| Film thickness [micrometer] | sp$^3$ content [%] | sp2 content [%] |
|---|---|---|
| 0.1 | 100 | 0 |
| 0.2 | 100 | 0 |
| 0.3 | 100 | 0 |
| 0.4 | 100 | 0 |
| 0.5 | 100 | 0 |
| 0.6 | 100 | 0 |
| 0.7 | 100 | 0 |
| 0.8 | 100 | 0 |
| 0.9 | 100 | 0 |
| 1   | 100 | 0 |
| 1.1 | 100 | 0 |
| 1.2 | 100 | 0 |
| 1.3 | 100 | 0 |
| 1.4 | 100 | 0 |
| 1.5 | 100 | 0 |
| 1.6 | 100 | 0 |
| 1.7 | 100 | 0 |
| 1.8 | 100 | 0 |
| 1.9 | 100 | 0 |
| 2   | 100 | 0 |
| 2.1 | 100 | 0 |
| 2.2 | 100 | 0 |
| 2.3 | 100 | 0 |
| 2.4 | 100 | 0 |
| 2.5 | 100 | 0 |
| 2.6 | 95  | 5 |
| 2.7 | 90  | 10 |
| 2.8 | 85  | 15 |
| 2.9 | 80  | 20 |
| 3   | 75  | 25 |
| 3.1 | 70  | 30 |
| 3.2 | 65  | 35 |
| 3.3 | 60  | 40 |
| 3.4 | 55  | 45 |
| 3.5 | 50  | 50 |

The invention can be used in micromechanical watch movements, in particular for the realisation of escapement wheels and pallets and other friction-relevant systems.

The above detailed description with reference to the drawings illustrates rather than limits the invention. There are numerous alternatives, which fall within the scope of the appended claims. For instance, the invention can also be used to enhance tribological performances in others macroscopic or microscopic mechanisms where at least one part/piece can be coated with diamond. Application examples are Micro-Electro-Mechanical Systems (MEMS), Nano-Electro-Mechanical Systems (NEMS), Electrical motors, in particular micro-motors, pumps, in particular micro-pumps, vacuum systems, static and/or kinetic systems such as engines, etc., without departing from the invention.

The word "comprising" does not exclude the presence of other elements or steps than those listed in a claim. The word "a" or "an" preceding an element or step does not exclude the presence of a plurality of such elements or steps. The mere fact that respective dependent claims define respective additional features, does not exclude a combination of additional features, which corresponds to a combination of dependent claims.

The invention claimed is:

1. A method for coating micromechanical components of a micromechanical system, including a watch movement, comprising:
providing a substrate component to be coated; and
providing said substrate component with a diamond coating, on a surface of said substrate component, of a given final thickness;
wherein said diamond coating is provided by CVD deposition in a reaction chamber;
wherein in a first phase of the CVD deposition process only sp3 hybridised carbon is deposited on said substrate over a first thickness;
wherein during a second phase of CVD deposition process, a controlled change of the carbon content within the reaction chamber is provided, thereby providing a change of the sp2/sp3 carbon bonds in a vicinity of the surface over a second thickness thereby forming an outer layer having a top, exterior surface; and
wherein the change of sp2/sp3 carbon bond is such that there is a gradual increase of sp2 hybridised carbon content towards the top, exterior surface.

2. The method for coating micromechanical components of a micromechanical system according to claim 1, wherein the second thickness is of the order of one micrometer.

3. The method for coating micromechanical components of a micromechanical system according to claim 1, wherein said change is an increase of the carbon content within the reaction chamber.

4. The method for coating micromechanical components of a micromechanical system according to claim 3, wherein said increase of carbon content is obtained by increasing the proportion of carbon containing reactant gas.

5. The method for coating micromechanical components of a micromechanical system according to claim 3, wherein said increase of carbon content is obtained by adding an additional carbon containing gas.

6. The method for coating micromechanical components of a micromechanical system according to claim 3 further comprising increasing the temperature and/or pressure within the processing reaction chamber so as to increase said carbon content.

7. The method for coating micromechanical components of a micromechanical system according to claim 3, further comprising adding gaseous nitrogen to the reaction chamber to increase said carbon content.

8. The method for coating micromechanical components of a micromechanical system according to claim 3, further comprising replacing hydrogen by argon to increase said carbon content.

9. The method for coating micromechanical components of a micromechanical system according to claim 3, further comprising adding at least one rare gas to increase said carbon content.

10. The method for coating micromechanical components of a micromechanical system according to claim 3, further comprising causing lattice distortion to increase said carbon content.

11. The method for coating micromechanical components of a micromechanical system according to claim 3, further comprising post-treatment consisting in adding metal containing compounds on top of the diamond in order to decrease the sticking properties.

12. The method for coating micromechanical components of a micromechanical system according to claim 3, further comprising post-treatment consisting in termination of the diamond-surface, wherein said termination is provided using an element selected from the list consisting of hydrogen, halogens, metals, electrical conductive minerals/organic molecules or proteins.

13. The micromechanical component for a micromechanical system, in particular a watch movement, wherein said component is obtained with a method according to claim 3.

14. A micromechanical component for a micromechanical system, including a watch movement, said component defining a substrate for an external surface layer made of diamond, wherein said diamond surface layer comprises a first portion in contact with the substrate of a first thickness, said first portion being constituted of sp3 hybridised carbon and a second portion remote from the substrate of a second thickness said second portion being constituted of a mix of sp2 and sp3 hybridised carbon, said second portion forming an outer layer having a top, exterior surface, the sp2 hybridised carbon content gradually increasing towards the top, exterior surface.

15. The micromechanical component for a micromechanical system according to claim 14 wherein said second portion comprises a gradual increase of sp2 hybridised carbon content.

16. The micromechanical component for a micromechanical system according to claim 14 wherein the second thickness is of the order of one micrometer.

\* \* \* \* \*